United States Patent
Tang et al.

(10) Patent No.: US 10,586,864 B2
(45) Date of Patent: Mar. 10, 2020

(54) VERTICAL TRANSISTOR WITH ONE-DIMENSIONAL EDGE CONTACTS

(71) Applicant: INTERNATIONAL BUSINESS MACHINES CORPORATION, Armonk, NY (US)

(72) Inventors: Jianshi Tang, Elmsford, NY (US); Qing Cao, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/055,128

(22) Filed: Aug. 5, 2018

(65) Prior Publication Data
US 2020/0044082 A1 Feb. 6, 2020

(51) Int. Cl.
*H01L 29/78* (2006.01)
*H01L 29/66* (2006.01)
*H01L 21/285* (2006.01)
*H01L 21/8234* (2006.01)
(Continued)

(52) U.S. Cl.
CPC .... *H01L 29/7827* (2013.01); *H01L 21/28556* (2013.01); *H01L 21/3086* (2013.01); *H01L 21/823487* (2013.01); *H01L 29/41741* (2013.01); *H01L 29/66553* (2013.01); *H01L 29/66666* (2013.01)

(58) Field of Classification Search
CPC ........... H01L 29/7827; H01L 21/28556; H01L 21/3086; H01L 21/823487; H01L 29/41741; H01L 29/66553; H01L 29/66666; H01L 29/7802; H01L 29/78642; H01L 29/1606
See application file for complete search history.

(56) References Cited

U.S. PATENT DOCUMENTS 5,231,037 A * 7/1993 Yuan ...................... H01L 29/207
148/DIG. 40
5,504,359 A 4/1996 Rodder
6,977,406 B2 12/2005 Kurabayashi
(Continued)

FOREIGN PATENT DOCUMENTS

KR 20120118566 A * 10/2012
WO WO-2004105140 A1 * 12/2004 ............. B82Y 10/00
WO 2016/071317 A1 5/2016

OTHER PUBLICATIONS

Roy et al., "Field-Effect Transistors Built from All Two-Dimensional Material Components," ACS Nano, 2014, 8 (6), pp. 6259-6264 (Year: 2014).*
(Continued)

*Primary Examiner* — Earl N Taylor
(74) *Attorney, Agent, or Firm* — Intelletek Law Group, PLLC; Gabriel Daniel, Esq.

(57) ABSTRACT

A vertical transistor and a method of creating thereof are provided. A substrate is provided. A first electrode, comprising a two-dimensional (2D) material, is defined on top of the substrate. A spacer is deposited on top of the first electrode. A second electrode, comprising a 2D material, is defined on top of the spacer. A mask layer is formed on top of the second electrode. A channel is formed on top of the mask layer. A gate dielectric layer is provided on top of the channel. A gate coupled to the second portion of the gate dielectric is provided.

20 Claims, 7 Drawing Sheets

(51) Int. Cl.
*H01L 21/308* (2006.01)
*H01L 29/417* (2006.01)

(56) References Cited

U.S. PATENT DOCUMENTS

| | | | | |
|---|---|---|---|---|
| 7,544,596 | B2* | 6/2009 | Ahn | C23C 16/40 |
| | | | | 438/591 |
| 7,781,827 | B2* | 8/2010 | Rao | B82Y 10/00 |
| | | | | 257/107 |
| 8,466,512 | B2 | 6/2013 | Masuoka | |
| 8,471,237 | B2* | 6/2013 | Okai | H01L 21/2855 |
| | | | | 257/621 |
| 8,633,055 | B2* | 1/2014 | Adkisson | H01L 29/66045 |
| | | | | 257/E21.001 |
| 8,884,345 | B2* | 11/2014 | Heo | H01L 29/1606 |
| | | | | 257/24 |
| 9,299,835 | B1* | 3/2016 | Anderson | H01L 29/7827 |
| 9,558,939 | B1* | 1/2017 | Stephenson | H01L 21/02507 |
| 9,577,049 | B1* | 2/2017 | Lin | H01L 29/45 |
| 9,905,663 | B2* | 2/2018 | Cheng | H01L 29/41791 |
| 2002/0145159 | A1* | 10/2002 | Ishii | G11C 16/0433 |
| | | | | 257/296 |
| 2002/0163079 | A1* | 11/2002 | Awano | B82Y 10/00 |
| | | | | 257/750 |
| 2012/0199815 | A1* | 8/2012 | Kondo | H01L 21/02381 |
| | | | | 257/29 |
| 2014/0021446 | A1 | 1/2014 | Lee et al. | |
| 2014/0087191 | A1 | 3/2014 | Chua | |
| 2014/0225066 | A1 | 8/2014 | Weber | |
| 2014/0231752 | A1* | 8/2014 | Shin | H01L 29/1606 |
| | | | | 257/29 |
| 2014/0312434 | A1 | 10/2014 | Krivokapic et al. | |
| 2014/0353754 | A1 | 12/2014 | Farmer | |
| 2015/0137075 | A1* | 5/2015 | Heo | H01L 27/0922 |
| | | | | 257/29 |
| 2015/0303315 | A1 | 10/2015 | Das et al. | |
| 2016/0043074 | A1* | 2/2016 | Hurley | H01L 21/8258 |
| | | | | 257/351 |
| 2016/0087042 | A1* | 3/2016 | Lee | H01L 29/1606 |
| | | | | 257/29 |
| 2016/0204162 | A1 | 7/2016 | Hu et al. | |
| 2016/0265047 | A1 | 9/2016 | van Rooyen et al. | |
| 2016/0336439 | A1 | 11/2016 | Lee et al. | |
| 2017/0018555 | A1 | 1/2017 | Kwan et al. | |
| 2018/0088379 | A1 | 3/2018 | Fan | |
| 2018/0151763 | A1 | 5/2018 | Heo et al. | |
| 2018/0182898 | A1 | 6/2018 | Moroz et al. | |
| 2018/0219055 | A1 | 8/2018 | Bu | |
| 2018/0294377 | A1* | 10/2018 | Fan | H01L 33/0041 |
| 2019/0074381 | A1* | 3/2019 | Park | H01L 21/02488 |
| 2019/0165120 | A1 | 5/2019 | Sato | |

OTHER PUBLICATIONS

Bitnell et al., "Field-Effect Tunneling Transistor Based on Vertical Graphene Heterostructures," Science, 335 (6071), 2012, pp. 947-950 (Year: 2012).*

Georgiou et al., "Vertical field-effect transistor based on graphene—WS2 heterostructures for flexible and transparent electronics," Nature Nanotechnology, 2013, 8, pp. 100-103 (Year: 2013).*

Giannazzo et al., "Vertical Transistors Based on 2D Materials: Status and Prospects," Crystals, 2018, 8, 70, pp. 1-25 (Year: 2018).*

Horri et al., "Modeling of a Vertical Tunneling Transistor Based on Graphene—MoS2Heterostructure," in IEEE Transactions on Electron Devices, vol. 64, No. 8, pp. 3459-3465, Aug. 2017. (Year: 2017).*

Geim, A.K. et al., "Van der Waals heterostructures"; Nature (2013); vol. 499; pp. 419-425.

Ma, C. et al., "Seamless Staircase Electrical Contact to Semiconducting Graphene Nanoribbons"; Nano Letters (2017); pp. 6241-6247.

Meersha, A. et al., "Record Low Metal—(CVD) Graphene Contact Resistance Using Atomic Orbital Overlap Engineering"; IEEE (2016); 4 pgs.

Wang, L. et al., "One-Dimensional Electrical Contact to a Two-Dimensional Material"; Science (2013); vol. 342:6158; pp. 614-617.

List of IBM Patents or Applications Treated as Related. Oct. 12, 2019.

* cited by examiner

VERTICAL TRANSISTOR WITH ONE-DIMENSIONAL EDGE CONTACTS

BACKGROUND

Technical Field

The present disclosure generally relates to semiconductor devices, and more particularly, to vertical field effect transistors (FETs) having reduced channel length and methods of manufacturing the same.

Description of the Related Art

Over the years, the semiconductor industry has maintained steady improvements in device performance by scaling. Indeed, transistor operating frequency (e.g., cut-off frequency $f_T$) could be increased by scaling its gate and/or channel length, which satisfied various high frequency applications. To maintain performance gains, different technologies are explored. One such technology includes the use of Two-dimensional (2D) materials in semiconductor structures.

Two-dimensional materials, sometimes referred to as single-layer materials, are crystalline materials that include a single layer of atoms. One such material is graphene, which is a layer of carbon atoms bonded in a honeycomb crystal lattice. Graphene provides a high carrier mobility at room temperature, low resistivity, and low noise. Some measurements have shown that graphene has a breaking strength 200 times greater than steel, with a tensile strength of 130 GPa. Additionally, graphene has thermal properties comparable to diamond for basal plane thermal conductivity. As to optical properties, graphene can be saturated readily under strong excitation over the visible to near-infrared region, due to the universal optical absorption and zero band gap, which permits application in ultrafast photonics.

SUMMARY

According to one embodiment, a vertical transistor includes a substrate. There is a first electrode that includes a two-dimensional (2D) material on top of the substrate. There is a spacer on top of the first electrode. There is a second electrode that includes a 2D material on top of the spacer. There is a mask layer on top of the second electrode. There is a channel that includes (i) a first portion on top of the mask layer and (ii) a second portion extending down to a first side surface of the mask layer, a first side surface of the second electrode a first side surface of the spacer, and a first side surface of the first electrode. There is a gate dielectric that includes a first portion on top of the first portion of the channel and a second portion that extends down to a first side surface of the channel. There is a gate coupled to the second portion of the gate dielectric.

In one embodiment, a channel length of the vertical transistor is based on a thickness of the spacer.

In one embodiment, the first electrode is configured as a source and the second electrode is configured as a drain.

In one embodiment, the first electrode is configured as a drain and the second electrode is configured as a source.

In one embodiment, the channel further includes a third portion on top of the substrate. The gate dielectric may further include a third portion on top of the third portion of the channel.

In one embodiment the 2D material of the first electrode and/or the second electrode is graphene.

In one embodiment, the 2D material of the first electrode is different from the 2D material of the second electrode.

According to one embodiment, a method of creating a vertical transistor is provided. A substrate is provided. A first electrode, comprising a two-dimensional (2D) material, is defined on top of the substrate. A spacer is deposited on top of the first electrode. A second electrode, comprising a 2D material, is defined on top of the spacer. A mask layer is formed on top of the second electrode. A channel is formed on top of the mask layer. A gate dielectric layer is provided on top of the channel. A gate coupled to the second portion of the gate dielectric is provided.

In one embodiment, the first electrode and the second electrode are synthesized via mechanical exfoliation and growth, followed by transferring.

In one embodiment, the mask layer is removed from the top of the second electrode.

In one embodiment, the channel includes (i) a first portion on top of the mask and (ii) a second portion extending down to a first side surface of the mask, a first side surface of the second electrode, a first side surface of the spacer, and a first side surface of the first electrode.

In one embodiment, a channel length of the vertical transistor is based on a thickness of the spacer.

In one embodiment, the first electrode is configured as a source and the second electrode is configured as a drain.

According to one embodiment, a vertical transistor includes a substrate. There is a first electrode that includes a two-dimensional (2D) material on top of the substrate. There is a spacer on top of the first electrode. There is a second electrode that includes a 2D material on top of the spacer. There is a channel that includes (i) a first portion on top of the second electrode and (ii) a second portion extending down to a first side surface of the mask layer, a first side surface of the second electrode a first side surface of the spacer, and a first side surface of the first electrode. There is a gate dielectric that includes a first portion on top of the first portion of the channel and a second portion that extends down to a first side surface of the channel. There is a gate coupled to the second portion of the gate dielectric.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
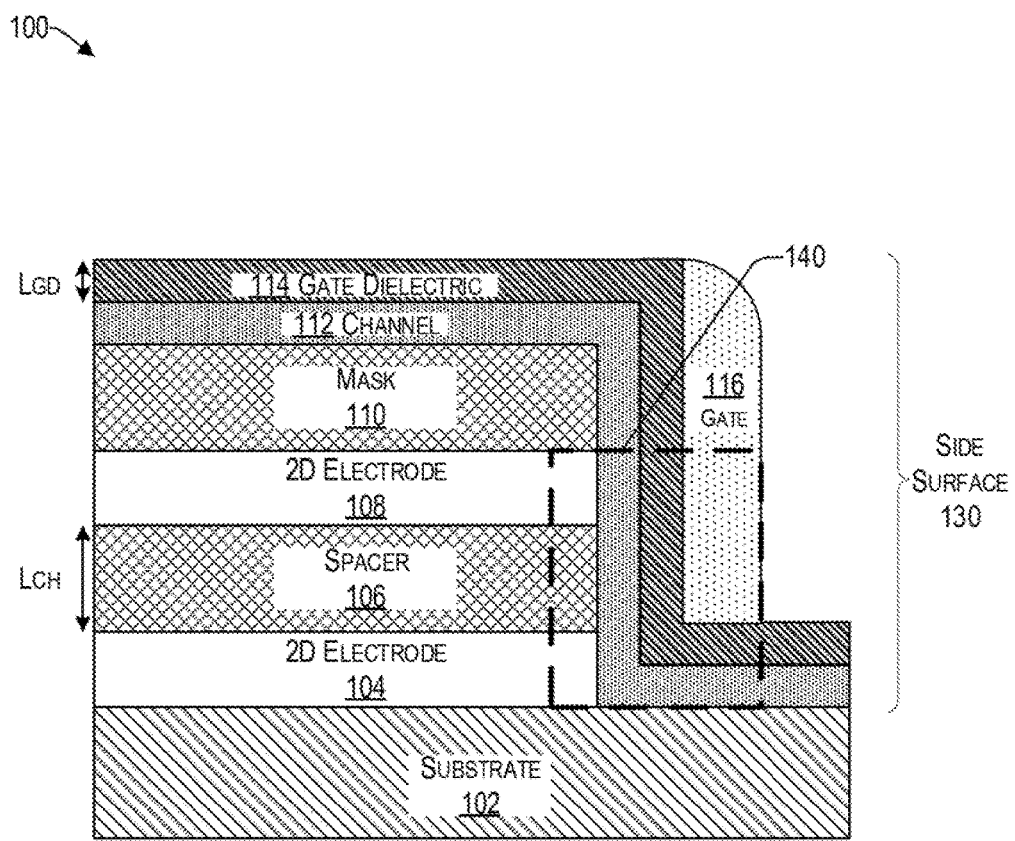
FIG. 1 is a simplified cross-section view of a vertical transistor, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," "above," "upper," "side," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a semiconductor substrate or semiconductor body. For example, substrate can be the surface of a wafer or a die.

As used herein, the term "vertical" describes an orientation that is arranged perpendicular to the first surface of the semiconductor substrate or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

The present disclosure relates to vertical field effect transistors (FETs) having reduced channel length and methods of manufacturing the same. The vertical transistor structures discussed herein include ultrathin 2D materials as source and drain contacts. The vertical transistor structures discussed herein overcome many of the scaling challenges of traditional planar field effect transistors. By virtue of using a vertical architecture and using 2D materials for the electrodes, dimensions of the transistor have been further reduced. Further, the channel length is relieved of the traditional lithographic constraints and becomes a function of the width of the spacer between the two electrodes. The smaller dimensions of the transistor further improve performance without degrading reliability.

The techniques described herein may be implemented in a number of ways. Example implementations are provided below with reference to the following figures.

Example Vertical Device

Reference now is made to FIG. 1, which is a simplified cross-section view of a vertical transistor, consistent with an illustrative embodiment. The semiconductor structure 100, representing a vertical field effect transistor (FET), may include a substrate 102. In various embodiments, the substrate 102, may comprise any suitable material or combination of materials, such as doped or undoped silicon, glass, dielectrics, etc. For example, the substrate may comprise a semiconductor-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating films on top.

Other materials that may be used for the substrate include, without limitation, sapphire, aluminum oxide, germanium, gallium arsenide (GaAs) or any of the other III-V periodic table compounds, indium phosphide (InP), silicon carbide (SiC), an alloy of silicon and germanium, etc. The substrate 102 can act as a conductor or an insulator, depending on the materials and concentrations chosen. Thus, as used herein, the term substrate 102 refers to a foundation upon which various semiconductor structures can be built.

There is a first electrode 104 comprising a two-dimensional (2D) material on top of the substrate 102. For example, the first electrode 104 may be a source or drain of the semiconductor structure 100. Single layer materials, sometimes referred to herein as conductive 2D materials, are crystalline materials having a single layer of atoms. In one embodiment, such 2D material may comprise a single layer of graphite. Other 2D materials may include, without limitation, isolated monolayers and few-layer crystals of black phosphorus, molybdenum disulfide ($MoS_2$), and other dichalcogenides and layered oxides.

There is a spacer 106, located on top of the first electrode. The spacer 106 is configured to insulate the first electrode 104 from the second electrode 108. The spacer 106 may comprise any suitable material, such as oxides, nitrides, or 2D insulators, etc. As illustrated in FIG. 1, the channel length of the transistor 100 is determined by the thickness of the spacer 106 ($L_{CH}$). The thickness of the spacer 106 ($L_{CH}$) is chosen based on the particular transistor requirements. In one embodiment, the spacer may comprise a 2D insulator, such as hexagonal boron nitride (hBN), that has a thickness that is approximately 1 nm or smaller. Such small dimension may be better appreciated in reference to a regular (i.e., horizontal FET), where the channel length is defined by lithography, the scaling of which is presently limited to an order of magnitude longer (e.g., approximately 10 nm).

There is a second electrode 108 comprising a 2D material on top of the spacer 106. The second electrode 104 may be a drain or source of the semiconductor structure 100. Thus, if the first electrode 104 is a source, then the second electrode 108 is a drain, and the reverse. In various embodiments, the 2D material used for the second electrode 108 may be the same or different from the first electrode 104.

In one embodiment, the source/drain to gate overlaps are determined by the thicknesses of the 2D materials of the electrodes (e.g., source and drain 104 and 108, respectively). In this regard, the thickness of the first and second electrodes can be approximately 1 nm or thinner. By virtue of using such small thicknesses for the source and drain, parasitic capacitance is reduced, thereby improving the speed of the transistor 100.

In one embodiment there is an etching mask layer 110, which is retained from an etching process to reduce the second electrode 108 (e.g., drain) to gate 116 capacitance.

There is a channel 112 comprising a first portion and a second portion. The first portion of the channel 112 is on top of the mask layer 110, while the second portion is on a first side surface of the mask layer 110, a first side surface of the second electrode 108, a first side surface of the spacer 106, and a first side surface of the first electrode 104, collectively referred to herein as a side surface 130 of the transistor. In one embodiment, there is a third portion of the channel 112 that is on top of the top surface of the substrate 102. The channel 112 may comprise any suitable one or more semiconductor materials or combinations thereof. In one embodiment, the channel 112 can be a 2D material, such as monolayers and few-layer crystals of graphene, black phosphorus, molybdenum disulfide ($MoS_2$), and other dichalcogenides and layered oxides. Other materials that may be used for the channel include, without limitation, silicon, germanium, gallium arsenide (GaAs) or any of the other III-V periodic table compounds, indium phosphide (InP), silicon carbide (SiC), an alloy of silicon and germanium, etc.

There is a gate dielectric layer 114 having a first portion and a second portion. The first portion of the gate dielectric 114 is on top of the channel 112 and parallel to the substrate 102, while the second portion is on the side surface of the transistor, adjacent to the second portion of the channel 112. In one embodiment, there is a third portion of the gate dielectric 114, which is on top of the third portion of the channel 112.

The gate dielectric 114 may comprise any suitable material including, but not limited to, $Al_2O_3$, $HfO_2$, SiN, polymer (e.g., NFC, ZEP520a, etc.), or any combination thereof. The gate dielectric 114 may have a physical thickness of about 2 nm to about 20 nm, although other thicknesses, materials, and/or formation processes may be used within the scope of the present disclosure.

There is a gate electrode 116 adjacent to the second portion of the gate dielectric 114, along the side surface of the transistor 100. The gate electrode 116 is electrically conductive and may comprise any suitable material or combination of materials. For example, the gate electrode 114 may comprise graphene, aluminum (Al), titanium (Ti), platinum (Pt), and/or gold (Au), or a combination thereof.

As illustrated in FIG. 1, the salient portions of the transistor 100 (i.e., highlighted by box 140) form a transistor built upward from the horizontal top plane of the substrate 102, rather than being horizontally planar on the top plane of the substrate 102, thereby creating a vertical transistor (i.e., instead of a conventional planar transistor). The essential transistor region 140 can have a very small footprint (e.g., having a vertical length of 10 nm or even smaller). By virtue of using a vertical structure, more transistors can be provided in a given area on the substrate 102. Further, by using 2D material for the electrodes 104 and 108, and by having a channel length that is a function of the thickness of the spacer 106 the dimensions of the vertical transistor are further reduced, thereby reducing parasitic components and improving speed.

Example Process for a Vertical Transistor

Figure 2:
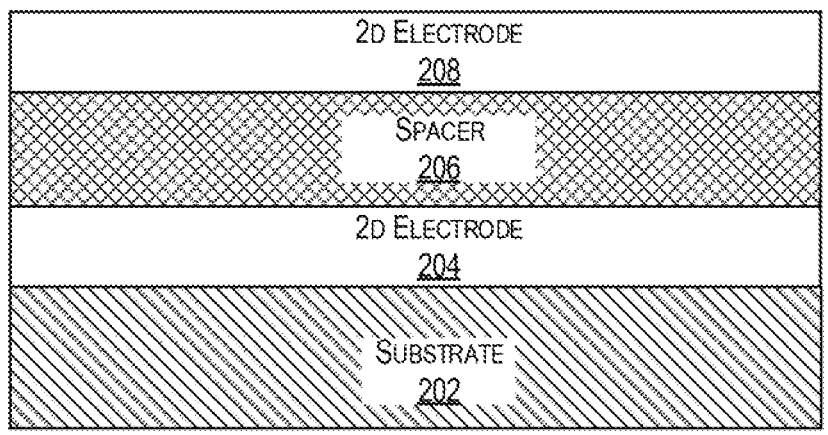
FIG. 2 illustrates a semiconductor structure that has undergone some semiconductor processing steps.

With the foregoing description of the structure of an example vertical transistor, it may be helpful to discuss an example process of manufacturing the same. To that end, FIGS. 2 to 7 illustrate various steps in the manufacture of a vertical transistor, consistent with exemplary embodiments. In particular, FIG. 2 illustrates a semiconductor structure 200 that has undergone some semiconductor processing steps. The process begins with a substrate 202, which may be insulating. The substrate may comprise any suitable material or combination of materials, such as doped or undoped silicon, glass, etc. In one embodiment, the substrate may comprise a semiconductor-on-insulator (SOI), e.g., with a buried insulator layer, or a bulk material substrate. The insulator layer (not shown) may comprise any suitable electrical insulator material, such as $SiO_2$, SiN, etc., and may be formed using conventional semiconductor processing techniques, such as thermal oxidation, chemical vapor deposition (CVD), physical vapor deposition (PVD), electrochemical deposition (ECD), molecular beam epitaxy (MBE), atomic layer deposition (ALD), etc.

Next, a first electrode 204 is defined, followed by a spacer 206, and a second electrode 208 of the transistor. The first and second electrodes (i.e., 204 and 208) comprise 2D material, and are configured to provide a source and drain of the transistor being created. In one embodiment, electrodes 204 and 206 can synthesized using a CVD method. In some embodiments, when building devices by stacking different 2D materials, mechanical exfoliation and growth followed by transferring can be used. Other possible synthesis methods include chemical exfoliation, hydrothermal synthesis, and thermal decomposition. In other embodiments, the 2D material can be grown on the material below it (e.g., the first electrode 204 directly on the substrate 202).

The spacer 206 may comprise any suitable material, such as oxides, nitrides, etc. For example, a silicon oxide film using a conventional deposition processes, such as a chemical vapor deposition (CVD) method may be used. In some embodiments anisotropic etching is then performed on this oxide film, such that the spacer is only at the desired locations (e.g., for FETs between their source and drain electrodes). The thickness of the spacer 106 ($L_{CH}$) is chosen based on the particular transistor requirements.

Figure 3:
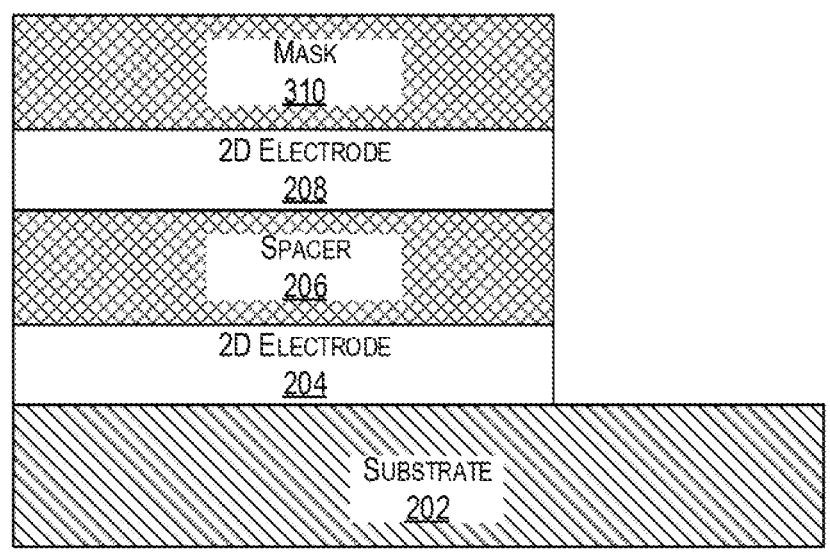
FIG. 3 shows the formation of an etching mask of a vertical transistor, consistent with an illustrative embodiment.

Reference now is made to FIG. 3, which shows the formation of an etching mask layer 310, consistent with an illustrative embodiment. For example, as is understood by those of ordinary skill in the art, a mask layer 310, sometimes referred to as a photomask, may be provided by forming a layer of photoresist material on the second electrode layer 208, exposing the photoresist material to a pattern of light, and developing the exposed photoresist material. An etching process, such as a reactive ion etch (ME), may be used to form patterns (e.g., openings) by removing portions of the second electrode 208, spacer 206 and first electrode 204, up to the top surface of the substrate 202, thereby creating a side surface of the vertical transistor. After etching, the mask layer 310 may be removed using a conventional plasma ashing or stripping process.

In one embodiment, the amount (e.g., percentage) of the removal of the mask 210 may be based on the density of the mask 210 (percentage of opening versus coverage) to prevent the mask 210 from crushing one or more layers below it or inducing a curvature thereon, due to the mask 210 weight or the mask residual stress that is multiplied by a continuous mask 210 area. The heavier the mask (e.g., due to its total thickness), and/or the higher the residual mask stress, the wider and/or more numerous the openings may be. In some embodiments, patterned dielectrics, such as oxide or nitride, can be used as the mask layer 310, and in some embodiments, the mask layer 310 is retained (i.e., not removed) at predetermined regions of the transistor to reduce the second electrode 208 (e.g., drain) to gate capacitance by increasing the spacing between the second electrode 208 and the gate electrode. The formation of the gate is discussed later in the context of FIGS. 5 and 6.

Figure 4:
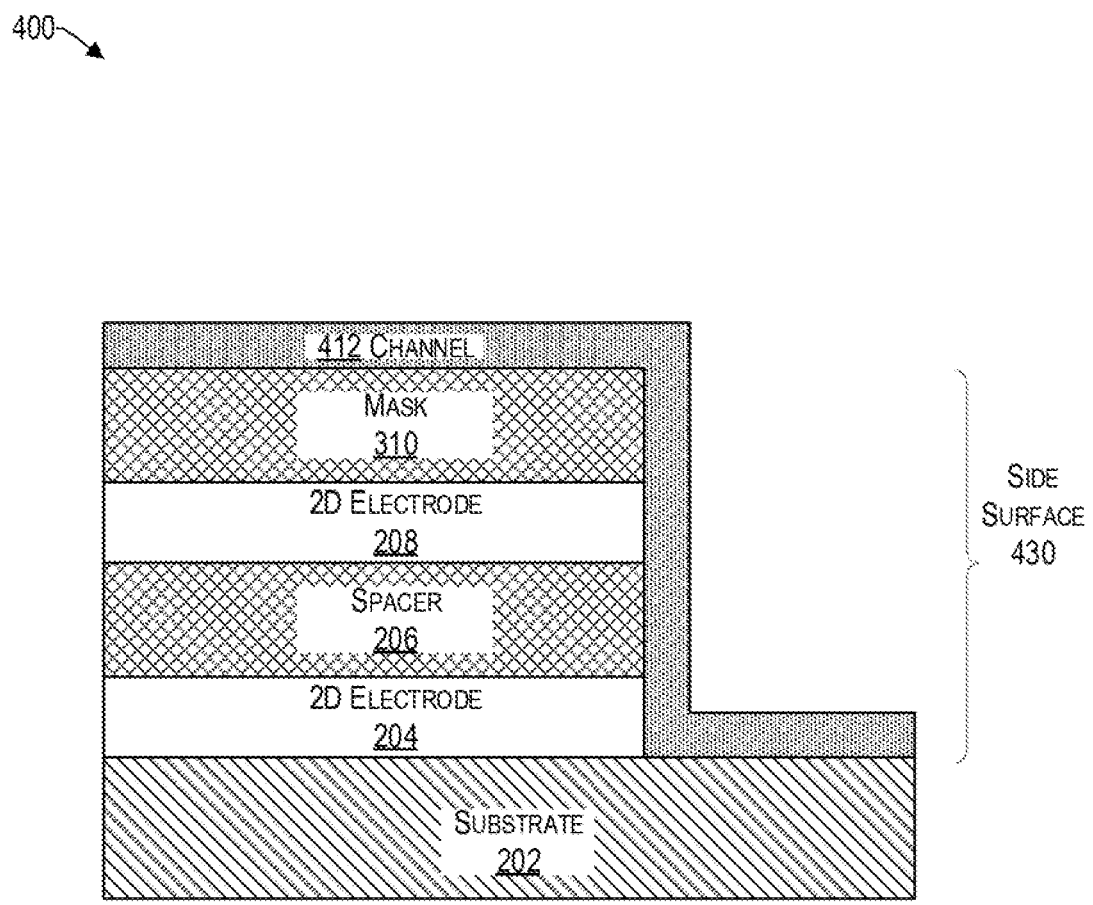
FIG. 4 shows the formation of a channel of a vertical transistor, consistent with an illustrative embodiment.

FIG. 4 shows the formation of a channel 412, consistent with an illustrative embodiment. A first portion of the channel 412 is deposited on top of the mask layer 310. A second portion of the channel 412 is deposited on the side surface 430 of the transistor being fabricated, including the first side surface of the mask layer 310, a first side surface of the second electrode 208, a first side surface of the spacer 206, and a first side surface of the first electrode 204, collectively referred to herein as a side surface 130 of the transistor. In one embodiment, there is a third portion of the channel 412 that is on top of the surface of the substrate 202 (e.g., that was exposed by a prior etching process.) The channel 412 can comprise any suitable semiconductor one or more materials or combinations thereof. In one embodiment, the channel 412 can comprise one or more 2D materials, such as monolayers and few-layer crystals of graphene, black phosphorus, molybdenum disulfide ($MoS_2$), and other dichalcogenides and layered oxides. Other materials that may be used for the channel include, without limitation, silicon, germanium, gallium arsenide (GaAs) or any of the other III-V periodic table compounds, indium phosphide (InP), silicon carbide (SiC), an alloy of silicon and germanium, etc.

In various embodiments, the channel 412 may be deposited by exfoliation then transfer, CVD, spin coating, or any other suitable method. In one embodiment, the channel region is patterned. Stated differently, the channel is removed in regions that are not essential for the function of the transistor. For example, the channel 412 can be retained in areas of the transistor to connect the first and second electrodes, including the spacer, to maintain the functionality of the transistor. However, in other regions (e.g., which don't directly affect the function of the transistor, the channel may be removed. In this way, the weight and/or stress from the channel are removed from non-essential portions. Further, by virtue of removing the channel from non-essential regions, cross-talk between transistors (which may be manufactured on the same wafer) can be reduced.

Figure 5:
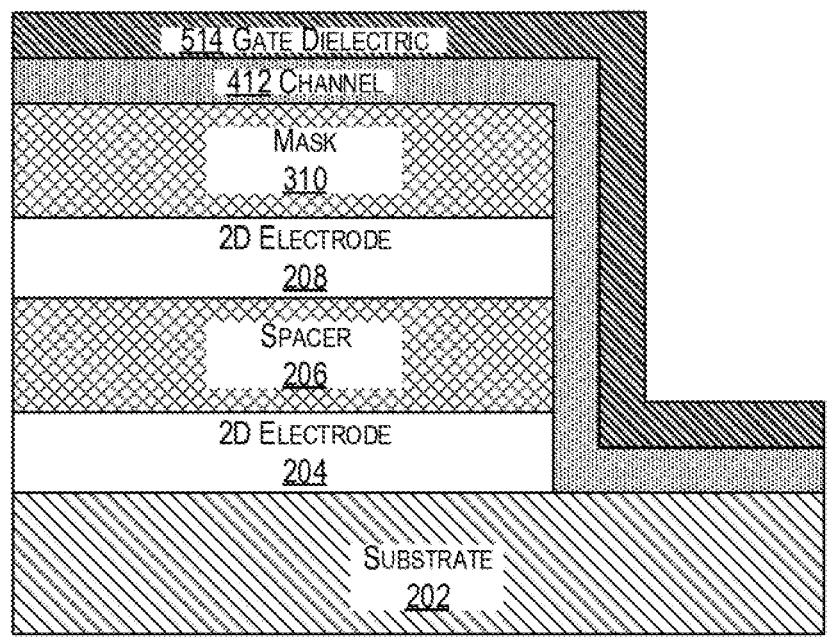
FIG. 5 which shows the formation of a gate dielectric of a vertical transistor, consistent with an illustrative embodiment.

Reference now is made to FIG. 5, which shows the formation of a gate dielectric 514 of a vertical transistor 500, consistent with an illustrative embodiment. The first portion of the gate dielectric 514 is deposited on top of the channel 412 (i.e., parallel to the substrate 202). The second portion of the gate dielectric 514 is deposited on the side surface of the transistor, adjacent to the second portion of the channel 412. In one embodiment, a third portion of the gate dielectric 514 is deposited on the third portion of the channel 412, which is parallel to the substrate 202.

The gate dielectric 514 may comprise any suitable material including, but not limited to, hexagonal boron nitride (hBN), $Al_2O_3$, $HfO_2$, SiN, polymer (e.g., NFC, ZEP520a, etc.), or any combination thereof. The gate dielectric 514 may be formed using conventional semiconductor processing techniques including, but not limited to, atomic layer deposition (ALD), e.g., for $Al_2O_3$ and/or $HfO_2$, plasma enhanced chemical vapor deposition (PECVD), e.g., for SiN, and spin-coating, e.g., for polymers. The resulting thickness $L_{GD}$ of the gate dielectric 514 may about 2 nm to about 20 nm, although other thicknesses, materials, and/or formation processes may be used depending on the application of the transistor 500.

Figure 6:
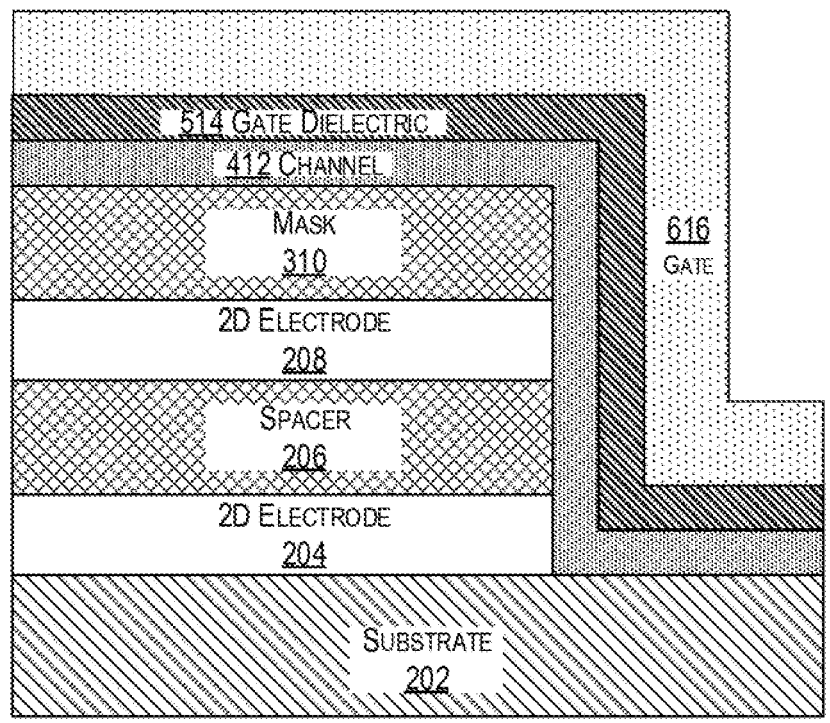
FIG. 6 shows the formation of a gate layer of a vertical transistor, consistent with an illustrative embodiment.

FIG. 6 shows the formation of a gate layer 616 of a vertical transistor 600, consistent with an illustrative embodiment. The first portion of the gate layer 616 is deposited on top of the first portion of the gate dielectric 514 and parallel to the substrate 202. The second portion of the gate layer 616 is deposited on the side surface of the transistor 600, adjacent to the second portion of the gate dielectric 514. The third portion of the gate layer 616 is deposited on top of the third portion of the gate dielectric 514 (i.e., parallel to the substrate 202).

The gate layer 616, sometimes referred to herein as the gate electrode or simply gate, is electrically conductive and may comprise any suitable material or combination of materials. For example, the gate layer 616 may comprise graphene, aluminum (Al), titanium (Ti), platinum (Pt), and/or gold (Au), or a combination thereof. The gate layer 116 may be formed using conventional semiconductor processing techniques, such as electron beam evaporation combined with a lift-off process, sputtering. The gate material 616 is not limited to the materials and processes described herein. Other suitable materials and/or formation processes are within the scope of the present disclosure.

Figure 7:
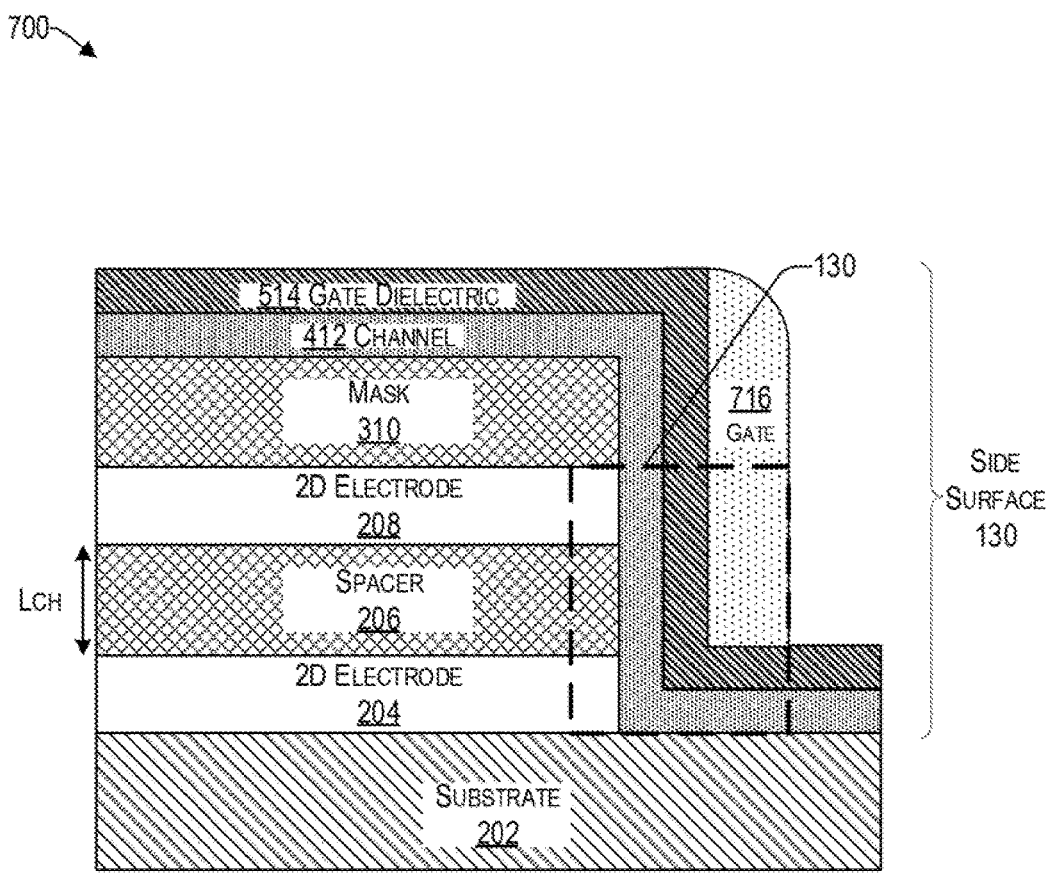
FIG. 7 illustrates a vertical transistor where the gate material has been removed in some areas, consistent with an exemplary embodiment.

In one embodiment, the gate layer 616 is etched away in areas where it is non-essential. In this regard, FIG. 7 illustrates a vertical transistor 700 where the gate material 716 has been removed in some areas, consistent with an exemplary embodiment. For example, in areas that are not immediately salient to the functioning of the transistor 700, the gate material can be removed via etching, leaving a "spacer" of the gate material on the sidewall as the gate electrode. To that end, preferably dry etching can be used, while wet etching can be used as well in some scenarios.

For example, referring back to FIG. 6, RIE may be used to form patterns (e.g., openings) in the gate layer 616 by removing portions of the gate layer 616 that are on top of the first portion of the gate dielectric 514, and at least part of third portion of the gate dielectric 514. The resulting structure of the gate electrode 716 is illustrated in FIG. 7. By virtue of removing the gate material from the aforementioned areas, parasitic capacitance between the gate electrode 716 and the second 2D electrode 208 is further reduced.

While the manufacture of a single transistor is being shown for simplicity, it will be understood that any desired number of transistors can be formed using similar processing steps concurrently in different parts of a substrate and/or wafer. In some embodiments, transistors may be further stacked on top of one another using layers and processing steps similar to those discussed above.

While a structure that has a side surface 130 that is perpendicular to the substrate 202 is illustrated for simplicity, it will be understood that other shapes and angles are supported as well. In various embodiments, the sidewall (i.e., side surface 130) may be arranged at different angles relative to an upper surface of the gate dielectric 514. For example, one or more layers (e.g., 514, 412, 310, 208, 206, and 204) may have a cross section that is trapezoidal in shape.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A vertical transistor, comprising:
a substrate;
a first electrode comprising a two-dimensional (2D) material on top of the substrate;
a spacer on top of the first electrode;
a second electrode comprising a 2D material on top of the spacer;
a mask layer on top of the second electrode;
a channel comprising (i) a first portion on top of the mask layer and (ii) a second portion extending down to a first side surface of the mask layer, a first side surface of the second electrode, a first side surface of the spacer, and a first side surface of the first electrode;
a gate dielectric comprising a first portion on top of the first portion of the channel and a second portion extending down to a first side surface of the channel; and
a gate coupled to the second portion of the gate dielectric.

2. The vertical transistor of claim 1, wherein a length of the channel is based on a thickness of the spacer.

3. The vertical transistor of claim 1, wherein:
the first electrode is configured as a source; and
the second electrode is configured as a drain.

4. The vertical transistor of claim 1, wherein:
the first electrode is configured as a drain; and
the second electrode is configured as a source.

5. The vertical transistor of claim 1, wherein the channel further comprises a third portion on top of the substrate.

6. The vertical transistor of claim 5, wherein the gate dielectric further comprises a third portion on top of the third portion of the channel.

7. The vertical transistor of claim 1, wherein the 2D material of at least one of the first electrode and the second electrode is graphene.

8. The vertical transistor of claim 1, wherein the 2D material of the first electrode is different from the 2D material of the second electrode.

9. The vertical transistor of claim 1, wherein the substrate comprises a silicon on insulator structure.

10. A method of fabricating a vertical transistor, comprising:
providing a substrate;
defining a first electrode, comprising a two-dimensional (2D) material, on top of the substrate;
depositing a spacer on top of the first electrode;
defining a second electrode, comprising a 2D material, on top of the spacer;
forming a mask layer on top of the second electrode;
forming a channel on top of the mask layer;
providing a gate dielectric layer on top of the channel; and
providing a gate coupled to a second portion of the gate dielectric.

11. The method of claim 10, wherein the first electrode and the second electrode are defined using a chemical vapor deposition (CVD) method.

12. The method of claim 10, wherein at least one of the first electrode and the second electrode are synthesized via mechanical exfoliation and growth, followed by transferring.

13. The method of claim 10, wherein the channel comprises (i) a first portion on top of the mask and (ii) a second portion extending down to a first side surface of the mask, a first side surface of the second electrode, a first side surface of the spacer, and a first side surface of the first electrode.

14. The method of claim 13, further comprising, etching away portions of the second electrode, spacer, and the first electrode, up to the top of the substrate, wherein the channel further comprises a third portion on top of the substrate.

15. The method of claim 10, wherein the gate dielectric comprises (i) a first portion on top of the first portion of the channel and (ii) the second portion extending down to a first side surface of the mask.

16. The method of claim 10, wherein the channel is deposited by chemical vapor deposition (CVD).

17. The method of claim 10, further comprising removing the gate from a top of a first portion of the channel.

18. The method of claim 10, wherein a channel length of the channel is based on a thickness of the spacer.

19. The method of claim 10, further comprising:
configuring the first electrode as a source; and
configuring the second electrode as a drain.

20. A vertical transistor, comprising:
a substrate;
a first electrode comprising a two-dimensional (2D) material on top of the substrate;
a spacer on top of the first electrode, wherein a length of the channel is based on a thickness of the spacer;
a second electrode comprising a 2D material on top of the spacer;
a channel comprising (i) a first portion on top of the second electrode and (ii) a second portion extending down to a first side surface of the second electrode, a first side surface of the spacer, and a first side surface of the first electrode;
a gate dielectric comprising a first portion on top of the first portion of the channel and a second portion extending down to a first side surface of the channel; and
a gate coupled to the second portion of the gate dielectric.

* * * * *